(12) United States Patent
Biedka

(10) Patent No.: US 7,576,615 B2
(45) Date of Patent: Aug. 18, 2009

(54) MULTI-POINT MODULATION AND VCO COMPENSATION

(75) Inventor: Thomas E. Biedka, San Jose, CA (US)

(73) Assignee: Panasonic Corporation, Osaka (JP)

( * ) Notice: Subject to any disclaimer, the term of this patent is extended or adjusted under 35 U.S.C. 154(b) by 123 days.

(21) Appl. No.: 11/890,597

(22) Filed: Aug. 6, 2007

(65) Prior Publication Data

US 2008/0055007 A1     Mar. 6, 2008

Related U.S. Application Data

(60) Provisional application No. 60/836,612, filed on Aug. 8, 2006.

(51) Int. Cl.
*H03L 7/00*     (2006.01)
(52) U.S. Cl. .................. 331/16; 331/34; 331/177 R
(58) Field of Classification Search .............. 331/16, 331/34, 177 R
See application file for complete search history.

(56) References Cited

U.S. PATENT DOCUMENTS 4,706,047 A * 11/1987 Avila et al. .............. 332/117

* cited by examiner

*Primary Examiner*—Arnold Kinkead

(57) ABSTRACT

The present invention, generally speaking, provides a VCO linearization technique applicable to advanced loop architectures. In particular, the linearization technique is applicable to a mostly-digital frequency locked loop (FLL), phase locked loop (PLL) or the like using multi-point modulation. In an exemplary embodiment, a correction table is used to form a corrected control variable that affects one modulation point only (e.g., a fast modulation path) of the multi-point modulation circuit. The other modulation point (e.g., a slow modulation path) of the multi-point modulation circuit is controlled in accordance with an error-forming circuit including a loop filter. The use of correction within the fast path enables the VCO to achieve more rapid phase changes than would otherwise be possible, an advantage in high-data-rate communications applications, for example.

12 Claims, 9 Drawing Sheets

MULTI-POINT MODULATION AND VCO COMPENSATION

RELATED APPLICATION(S):

This patent application claims priority under 35 U.S.C. § 119(e) of the co-pending, co-owned U.S. Provisional Patent Application No. 60/836,612, filed Aug. 8, 2006, and entitled "MULTI-POINT MODULATION AND VCO COMPENSATION" which is also hereby incorporated by reference in its entirety.

FIELD OF THE INVENTION

The present invention relates to linearization techniques for voltage controlled oscillators (VCOs) and the like, which are commonly used in frequency synthesizers, including direct digital frequency synthesizers.

BACKGROUND OF THE INVENTION

Direct digital frequency synthesis (DDFS) consists of generating a digital representation of a desired signal, using logic circuitry and/or a digital computer, and then converting the digital representation to an analog waveform using a digital-to-analog converter (DAC). Such systems can be compact, low power, and can provide very fine frequency resolution with virtually instantaneous switching of frequencies.

A known DDFS system is shown in FIG. 1. A digital modulation signal is input to DDS accumulator logic, the output of which indexes into a read-only memory (ROM). An output signal of the ROM is converted to an analog signal by a DAC. An output signal of the DAC may be smoothed using a filter (not shown) to produce a periodic (e.g., sinusoidal) signal. The DDFS of FIG. 1 is exemplified by U.S. Pat. No. 4,746,880, incorporated herein by reference.

Other DDFS variations are shown in FIG. 2, FIG. 3 and FIG. 4. In FIG. 2, the DDFS of FIG. 1 is incorporated into a conventional PLL structure including a phase/frequency detector (PFD), an analog loop filter and a voltage controlled oscillator (VCO). In FIG. 3, the ROM and the DAC of FIG. 2 are omitted, and the most significant bit (MSB) from the DDS block is input directly to the PFD. In FIG. 4, an output signal of the DDS block is filtered using a direct time filter as described in U.S. Pat. No. 5,247,469, incorporated herein by reference. One of the challenges of DDFS has been to generate a clean, precisely-modulated waveform. Because of limited time resolution and edge misalignment, spurious output signal transitions ("spurs") occur. Precision modulation is also a problem in conventional analog frequency synthesizers using a PLL. The problem occurs that the PLL treats signal modulation as drift and attempts to cancel the modulation.

Circuit arrangements devised in an attempt to overcome this problem are shown in FIG. 5 and FIG. 6. In FIG. 5, a summing node is provided following the loop filter to which a modulation signal is applied. Details of the summing node are illustrated in exploded view. In FIG. 6, showing the Ewart modulator, a resistive divider network is inserted into the ground reference of the loop filter, and a modulation signal is applied to the resistive divider network as shown. In effect, the ground reference of the loop filter is shifted by the modulation signal, resulting in an output signal of the loop filter being shifted by the amount of the modulation. In FIG. 7, a modulation signal is capacitively coupled to a node of the loop filter circuit. The foregoing circuit arrangements do not enjoy the benefits of DDS.

As evidenced by the foregoing circuits, the voltage controlled oscillator (VCO) is widely used, particularly in communications circuits. Like many electronic components, the VCO has a linear operating region and a non-linear operating region, near one or both extremes of the operational range of the VCO. To meet demanding performance standards, it may be necessary to extend the linear operating region of a VCO. Various linearization techniques for VCOs have been described. An example of one such technique is described in U.S. Pat. No. 6,285,263.

Unfortunately, known methods of VCO linearization are not readily applicable to advanced loop architectures.

SUMMARY OF THE INVENTION

The present invention, generally speaking, provides a VCO linearization technique applicable to advanced loop architectures. In particular, the linearization technique is applicable to a mostly-digital frequency locked loop (FLL), phase locked loop (PLL) or the like using multi-point modulation. In an exemplary embodiment, a correction table is used to form a corrected control variable that affects one modulation point only (e.g., a fast modulation path) of the multi-point modulation circuit. The other modulation point (e.g., a slow modulation path) of the multi-point modulation circuit is controlled in accordance with an error-forming circuit including a loop filter. The use of correction within the fast path enables the VCO to achieve more rapid phase changes than would otherwise be possible, an advantage in high-data-rate communications applications, for example.

BRIEF DESCRIPTION OF THE DRAWINGS

The present invention may be further understood from the following description in conjunction with the appended drawing. In the drawings.

DETAILED DESCRIPTION OF THE PREFERRED EMBODIMENTS

Figure 8:
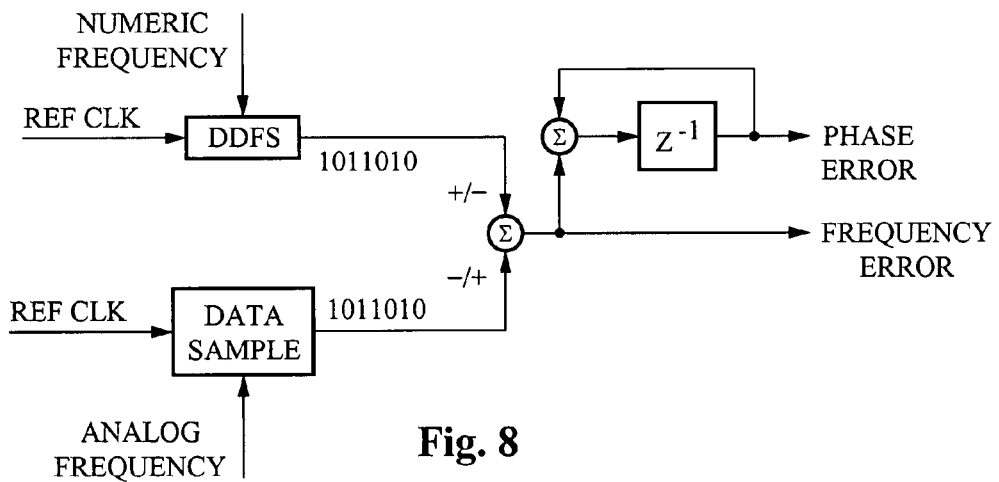
FIG. 8 is a diagram of a digital "difference engine" for use in a synthesizer.

Referring now to FIG. 8, a diagram is shown of a difference engine in accordance with one aspect of the present invention. The overall function of the difference engine is to produce digital data streams representing the frequency error and (optionally) the phase error between an analog frequency and a numeric frequency. A reference clock and a numeric frequency are input to a DDS block. In response to the reference clock and the numeric frequency, the DDS block outputs a digital stream representing the numeric frequency. Similarly, the reference clock and an analog frequency are input to a Data Sample block. In response, the Data Sample block outputs a digital stream representing the analog frequency. The two digital streams are summed with opposite polarities. The resulting summation is a digital stream representing the frequency error between the analog frequency and the numeric frequency, the digital stream having values of +1, −1 and 0. If the analog frequency and the numeric frequency are identical, then the digital stream representing the frequency error will be all zeros. Digital integration of the frequency error may be performed using a digital integrator to produce a digital stream representing the phase error between the analog frequency and the numeric frequency.

Figure 9:
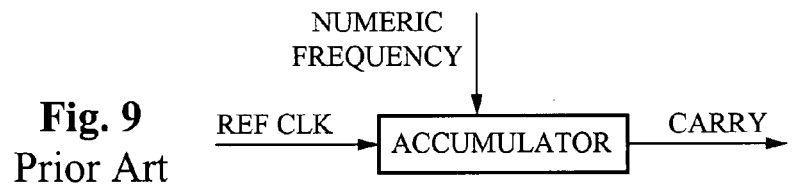
FIG. 9 is a diagram illustrating in greater detail the DDS block of FIG. 8.
Figure 10:
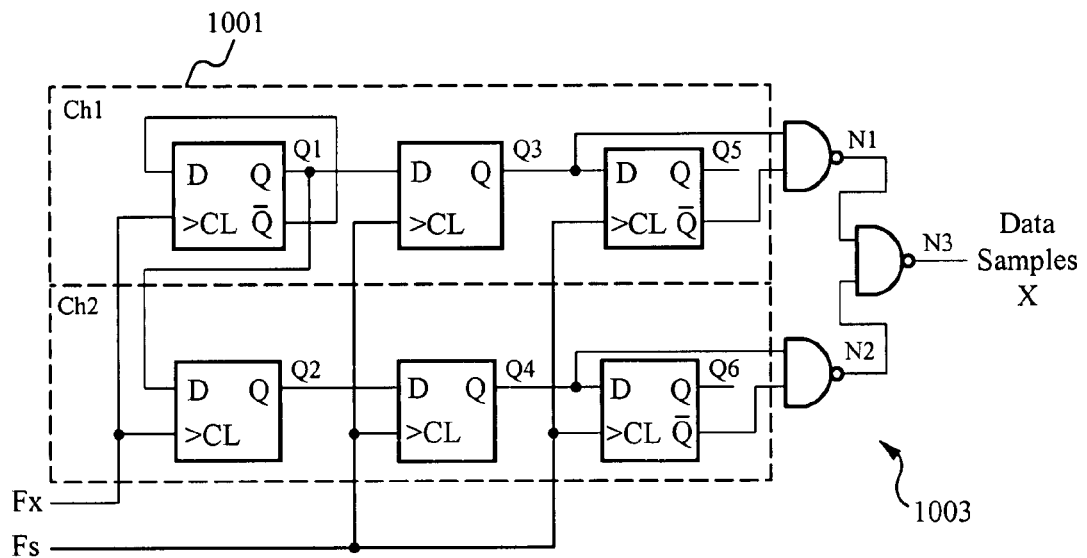
FIG. 10 is a diagram illustrating in greater detail the Data Sample block of FIG. 8.

The DDS block may be realized as a simple accumulator, for example, as shown in FIG. 9. Alternatively, the DDS block may be second order instead of first order. The Data Sample block may be realized as shown in FIG. 10. In the illustrated embodiment, it is assumed that the ratio of the clock signals is such that no more than one rising edge of the faster clock will occur during a single period of the slower clock. In other embodiments, this assumption need not apply. The capture circuit includes an input portion 1001 and an output portion 1003. The input portion includes two sections Ch1 and Ch2 that must be carefully matched to minimize errors. Each section comprises a chain of two or more D flip-flops coupled in series. In the following description, the same reference numerals will be used to reference the respective flip-flops themselves and their respective output signals. Within each section, the first flip-flop in the chain is clocked by a sampled clock signal Fx. The succeeding flip-flops in the chain are clocked by a sampling clock signal Fs. The D input of the first flip-flop Q1 in the upper section is coupled to the Q output of the same. The D input of the first flip-flop in the lower section is coupled to the Q output of the first flip-flop in the upper section. The remaining flip-flops in both sections are coupled in series—i.e., Q to D, Q to D.

The function of the input portion is to 1) produce two signals, logical inverses of one another, that transition on rising edges of the clock signal Fx; 2) to latch the values of the two signals on the rising edge of the clock signal Fs; and 3) to detect transitions from one clock to the next. The intermediate stages Q3 and Q4 may be required to minimize metastability resulting from the asynchrony of the two clock signals, and in fact multiple such stages may be desirable in a particular design. The output portions includes, in an exemplary embodiment, three two-input NAND gates. Respective NAND gates N1 and N2 are coupled to the D and Q signal of the final flip-flop stages of the input sections. Output signals of the NAND gates N1 and N2 are combined in the further NAND gate N3 to form the final output of the capture circuit. The function of the output portion is to detect a change in the input clock signal level from one sample clock to the next in either of two channels formed by the two input sections. The two input sections function in a ping-pong fashion, alternately detecting changes in the input clock signal level.

Figure 11:
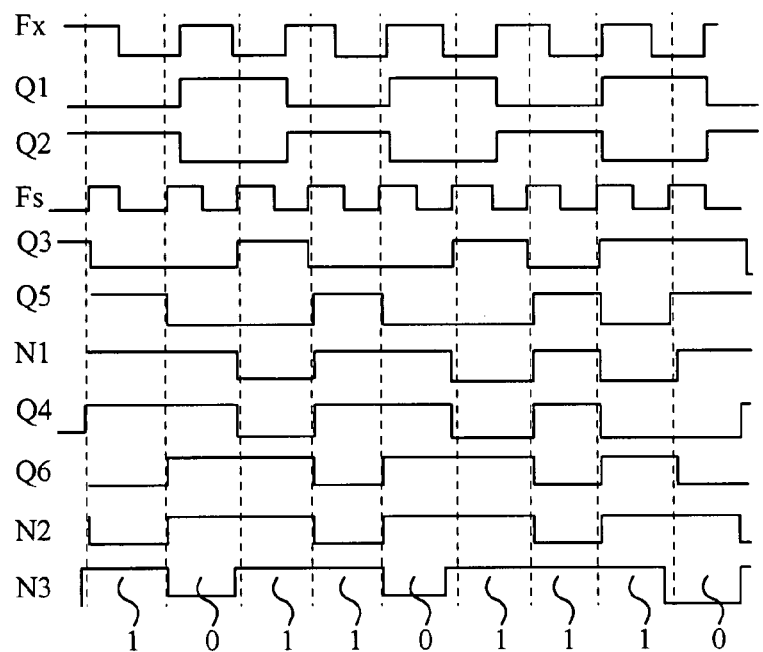
FIG. 11 is a timing diagram illustrating operation of the Data Sample block of FIG. 10.

Operation of the capture circuit of FIG. 10 may be more fully appreciated with reference to the timing diagram of FIG. 11. The first stages of the two channels form inverse signals Q1 and Q2 approximately coincident with (but slightly delayed from) rising edges of the input clock signal. The signals Q3 and Q4 are formed by sampling the signals Q1 and Q2, respectively, in accordance with the sample clock. The signals Q5 and Q6, respectively, are delayed replicas of the signals Q3 and Q4. The NAND gates together realize the logic function X=Q3.Q5 v Q4.Q6. In the example of FIG. 11, the illustrated signals are all idealized square-wave signals. In actuality, the signals will have finite rise and fall times.

Figure 12:
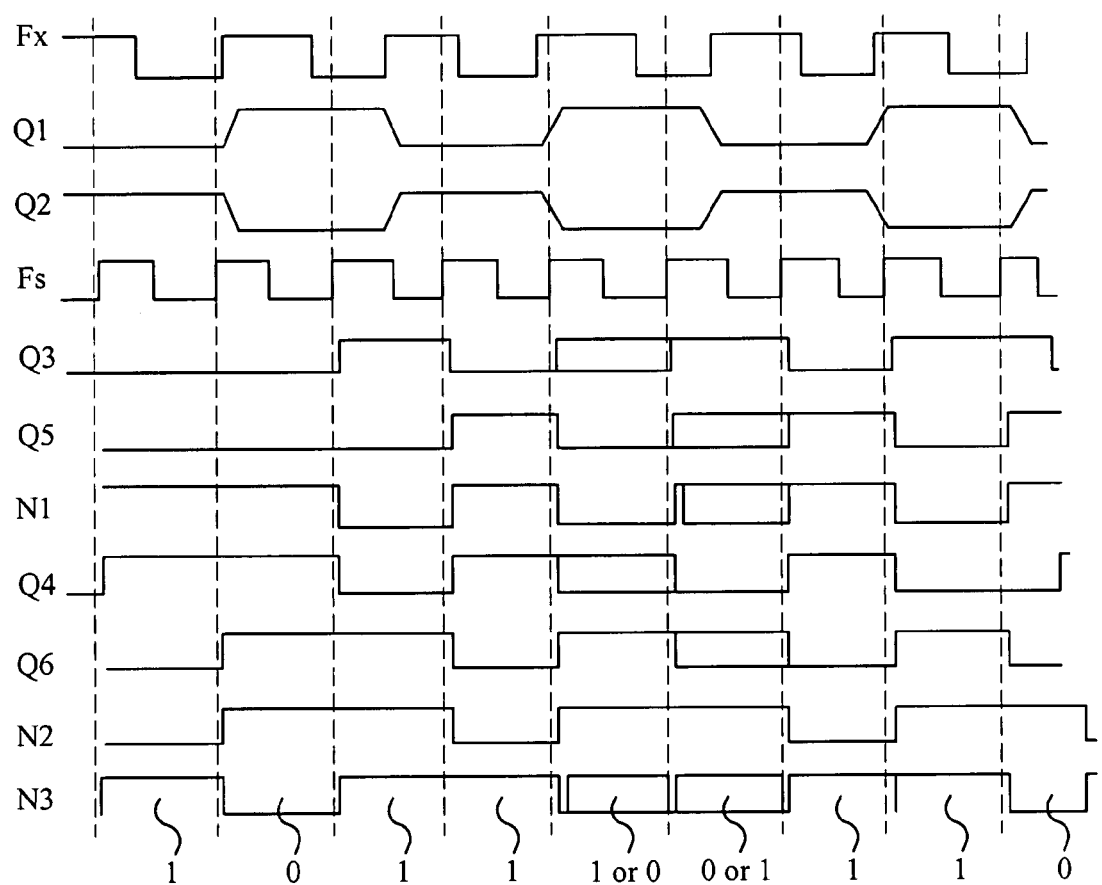
FIG. 12 is a timing diagram illustrating a possible temporary metastable condition of the Data Sample block of FIG. 10.

The possible effect of the finite rise and fall times of the signals Q1 and Q2 and the asynchrony of the circuit is metastability, as illustrated in FIG. 12. Here, the signals Q3 and Q5 and the signals Q4 and Q6 are each in an indeterminate state for one cycle. The resulting output of the circuit may or may not be correct. However, because the decision was a "close call" to begin with, the effect of an occasional erroneous decision on the overall operation of the circuit is negligible. The time window of instability is reduced by increasing the overall gain in the path. If the gain in Q3 and Q9 is sufficient to reduce the probability of an error to an acceptable level, then no additional circuitry is required. If not, then additional circuitry will be required to increase the gain. If the Data Sample block is realized as shown in FIG. 10, then if the DDS block is second order, the digital streams will not match exactly even when the analog frequency and the numeric frequency exactly coincide. A second-order construction of the DDS block may nevertheless be beneficial in reducing tonal noise.

Figure 13:
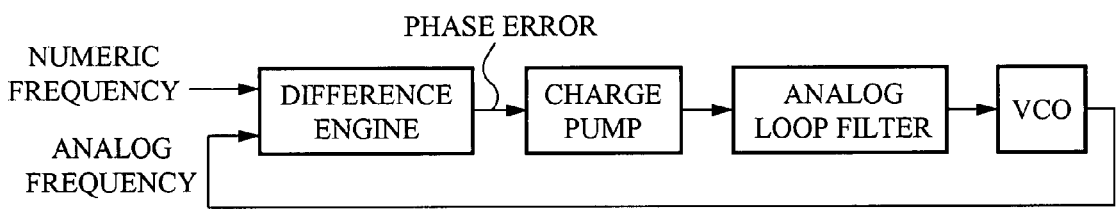
FIG. 13 is a diagram of a basic PLL structure using the difference engine of FIG. 8.

The difference engine of FIG. 8 may be used to realize a basic PLL as shown in FIG. 13. The phase error signal is input to a charge pump having a pullup current source and a pull-down current source. Depending on the current value of the digital phase error stream, one or the other current source is activated, or neither current source is activated. An output signal of the charge pump is input to a loop filter. An output of the loop filter is input to a voltage-controlled oscillator (VCO). Finally, an output of the VCO is input to the Data Sample block as the analog frequency, closing the loop. As compared to a PLL using a conventional phase/frequency detector (PFD), the PLL of FIG. 13 has the advantage that it achieves smooth lock and will not "slip lock." In the PLL of FIG. 13, the numeric frequency may be modulated to achieve modulation. This "direct modulation" is subject to loop bandwidth constraints as described in relation to the prior art.

Figure 14:
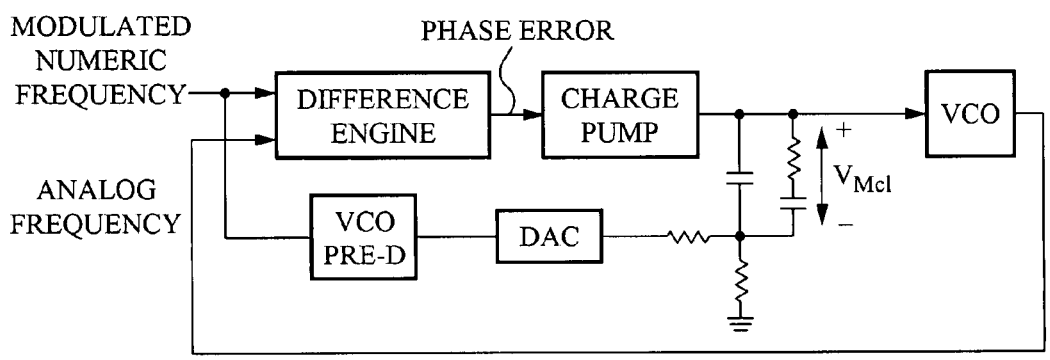
FIG. 14 is a diagram of a PLL structure having a digital modulation input and an auxiliary modulation path.

Referring to FIG. 14, a PLL having improved modulation properties is shown. A numeric modulation input is applied to the difference engine for direct modulation. In addition, the numeric modulation input is applied to an optional VCO predistortion block, the output of which is applied to a DAC. An output voltage produced by the DAC is applied to a node of the loop filter. The PLL of FIG. 13 has the property that if the direct modulation gain is exactly matched in the auxiliary modulation path, then the output frequency of the PLL can be changed without changing the closed-loop modulation voltage VMcl. This property in turn implies that modulation is not subject to loop bandwidth constraints. The loop bandwidth may be set to an arbitrarily low level, for example, allowing DDS spurs to be filtered down to any desired level. In the foregoing multi-point modulation arrangement, the path through the difference engine may be considered a "slow path," and the path through the DAC may be considered a "fast path."

The optional VCO predistortion block may be used to compensate for distortion of the VCO. In an exemplary embodiment, the VCO predistortion block may take the form of a correction table, or lookup table. The placement of the VCO predistortion block is such that it forms a corrected control variable that affects one modulation point only (e.g., the fast modulation path) of the multipoint modulation circuit. The other modulation point (e.g., the slow modulation path) of the multi-point modulation circuit is controlled in accordance with an error-forming circuit (the difference engine) and the loop filter. With this arrangement, the linearization technique is applicable to advanced loops like that of FIG. 14, e.g., mostly-digital frequency locked loop (FLL), phase locked loop (PLL) or the like using multi-point modulation. The use of correction within the fast path enables the VCO to achieve more rapid phase changes than would otherwise be possible, an advantage in high-date-rate communications applications, for example.

In some embodiments, rather than populate the correction table at manufacture based on measured characteristics of a particular VCO, the correction table may be populated automatically during operation, in the following manner.

In some embodiments, the correction table may be updated continuously or periodically to account for changes in the characteristics of the VCO over operating conditions and over time.

Further loop architectures will now be described to which the foregoing linearization techniques may be applied.

Figure 15:
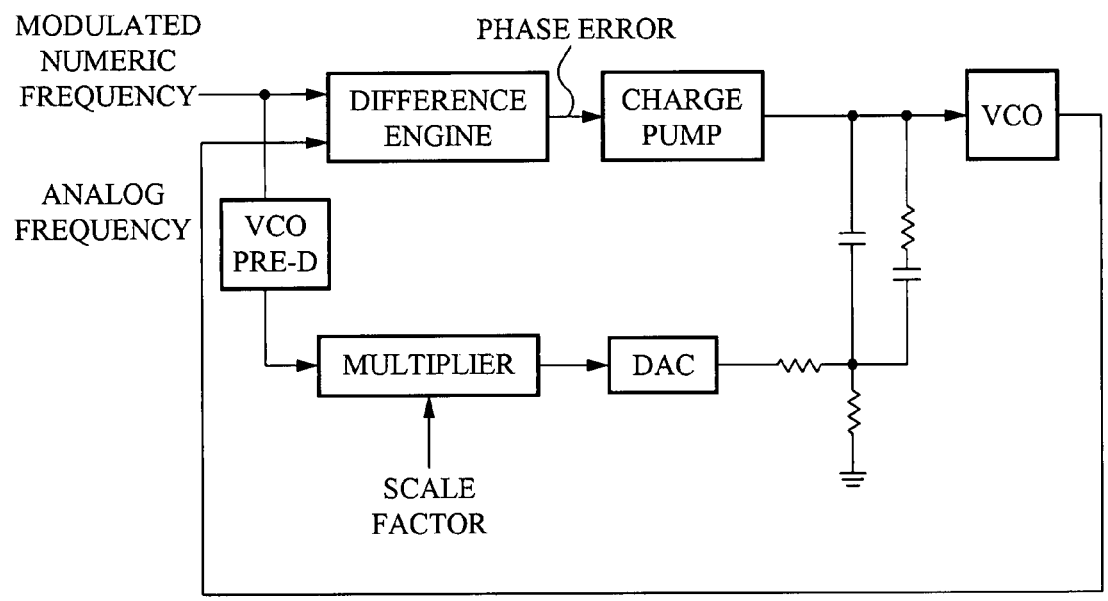
FIG. 15 is a diagram of a modified PLL structure.

Referring to FIG. 15, to allow the direct modulation gain to be matched in the auxiliary modulation path, a multiplier is provided. The multiplier applies a scale factor to the numeric modulation input prior to its application to the DAC. A method by which the appropriate scale factor may be determined is described hereafter. Referring still to FIG. 15, to achieve a low loop bandwidth (e.g., for spur reduction), large-valued capacitors are required to be used within the loop filter. Large capacitors are bulky and costly. Furthermore, the VI characteristics of large capacitors exhibit undesirable non-linearities due to dielectric absorption.

Figure 16:
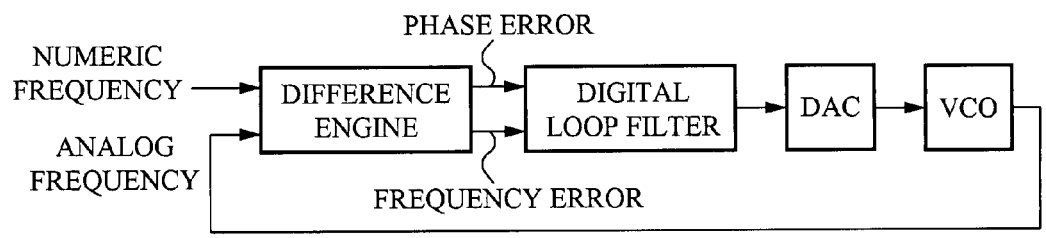
FIG. 16 is a diagram of a PLL structure having a digital loop filter followed by a DAC.
Figure 17:
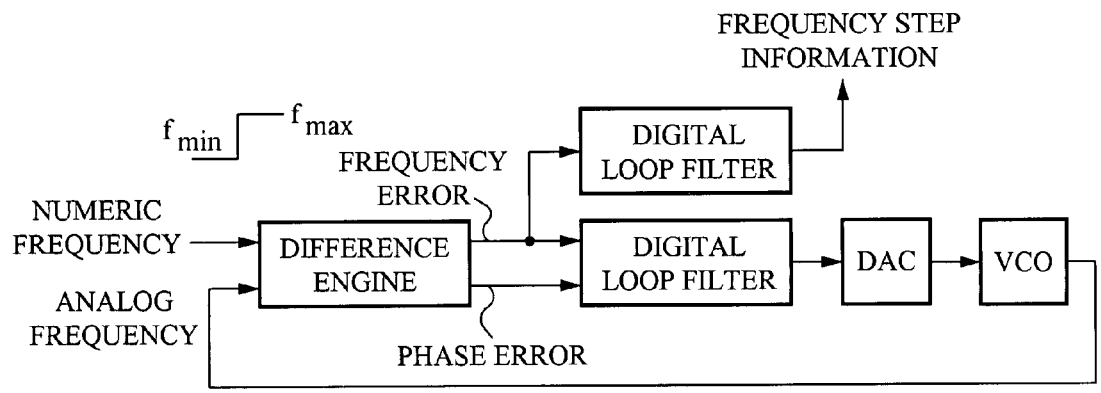
FIG. 17 is a diagram of a PLL structure in which a digital FIR filter is used for calibration.

A low loop bandwidth may be obtained instead using a digital loop filter followed by a DAC as shown in FIG. 16, in which the separate modulation path has been omitted. Referring to FIG. 17, the scale factor described previously may be determined by measuring a maximum frequency step using a digital filter. To do so, the minimum numeric frequency is first applied to the difference engine. Then the maximum numeric frequency is applied. The frequency error signal produced by the difference engine is filtered using a finite impulse response filter (FIR), for example. The FIR filter measures the maximum frequency step. The appropriate scale factor may be determined by dividing the observed maximum frequency step by the desired maximum frequency step. Preferably, calculation of the scale factor is iterated multiple times. For each successive iteration, the value obtained for the scale factor will more closely approximate the scale factor required for exact matching. Calibration may be performed at power-on and may optionally be performed thereafter at intervals or as required.

Figure 18:
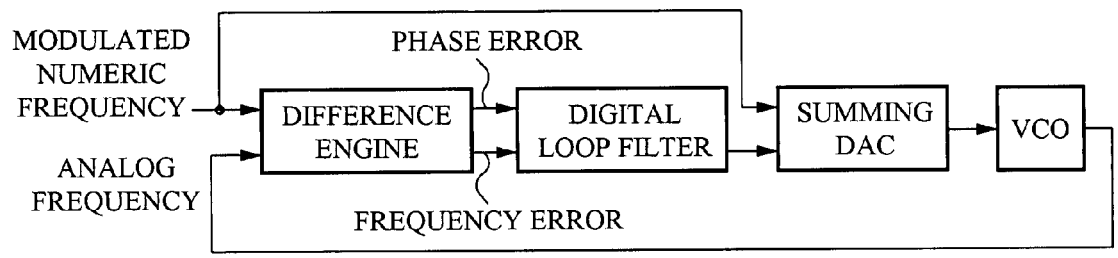
FIG. 18 is a diagram of a PLL like that of FIG. 16 but having an auxiliary modulation path coupled to the DAC.

Referring to FIG. 18, in the case of a digital filter followed by a DAC, the auxiliary modulation path may be achieved using a summing DAC. An analog modulation signal is input directly to the DAC along with the output of the digital loop filter. The embodiment of FIG. 18 avoids the need for large-value capacitors. Depending on application requirements, however, the embodiment of FIG. 18 may require a high-resolution DAC. In the case of a VCO having a sensitivity of 40 MHz/V, for example, if accuracy is desired, then a 20-bit DAC would be required. Such resolution is difficult and expensive to achieve.

Figure 19:
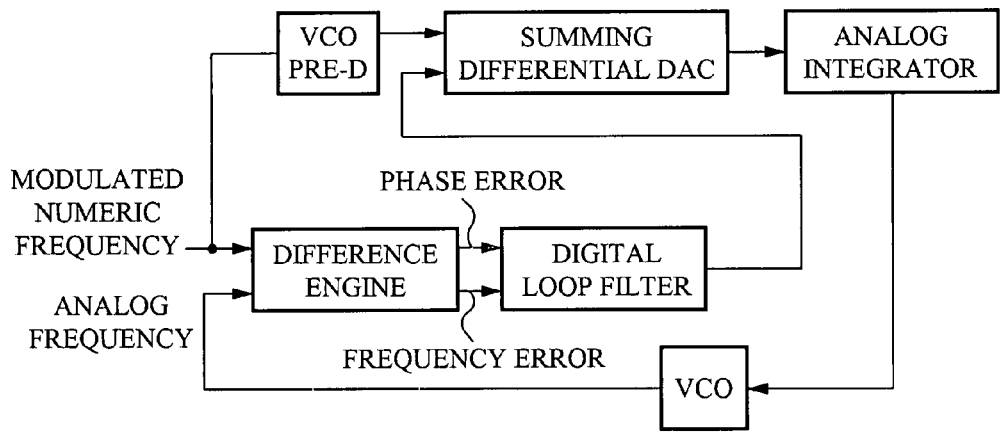
FIG. 19 is a diagram of a PLL structure using a differential DAC of comparatively low resolution.
Figure 21:
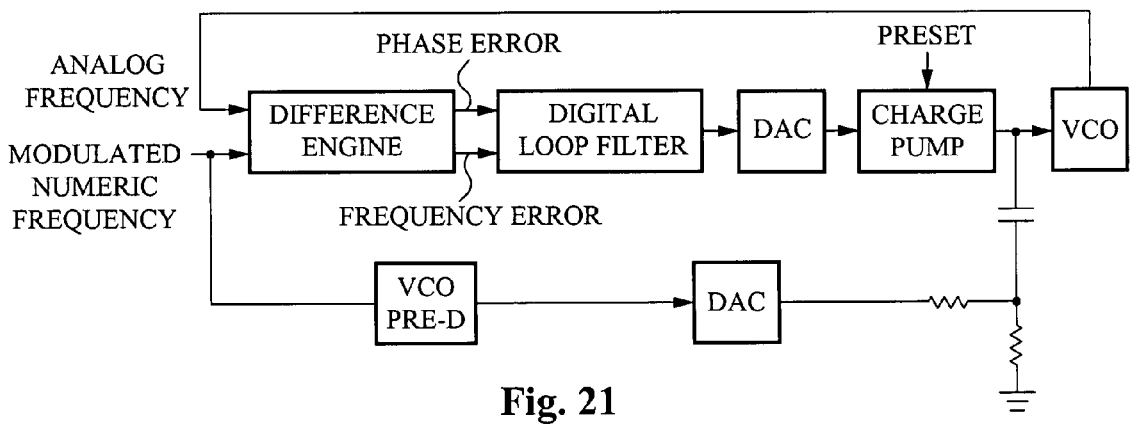
FIG. 21 is a diagram of a PLL structure having a preset circuit.

Various different techniques may be used to reduce the resolution requirements of the DAC. Two such techniques are illustrated in FIG. 19 and FIG. 21, respectively. Referring to FIG. 19, the need for a high-resolution DAC may be avoided using a differentiating DAC followed by an analog integrator. As compared to a 20-bit DAC in FIG. 18, in the embodiment of FIG. 19, the DAC may be a 12-bit Sigma-Delta DAC, for example.

Figure 20:
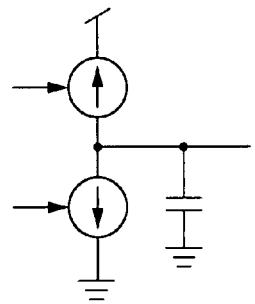
FIG. 20 is a diagram of an analog integrator that may be used in the PLL of FIG. 19.

The analog integrator may be realized as a charge pump coupled to an integrating capacitor as shown in FIG. 20. Referring to FIG. 21, a charge pump has associated with it a tuning capacitor and a PRESET input. A voltage from a modulation DAC is applied through a resistive divider to a bottom plate of the tuning capacitor. If the voltage from the modulation DAC is highly attenuated by the resistive divider, then the DAC may be of comparatively low resolution, e.g., 14 bits. In FIG. 21, as in FIG. 19, the upper (main loop) DAC is a differential DAC that produces a derivative of the desired voltage, which derivative is integrated by operation of the charge pump and capacitor to produce a voltage that is applied to the VCO. The circuit of FIG. 21 is especially well-suited for cellular applications, for example, in which the transmitter jumps to a particular band in order to transmit a short burst. To do so, a preset signal is applied to the preset circuit to cause the PLL to jump to the desired band. The preset signal is then removed, after which a burst is then transmitted. The same sequence of events then repeats some time later.

Figure 1:
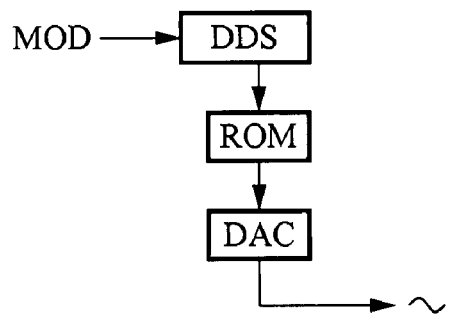
FIG. 1 is a block diagram of a known DDFS.
Figure 2:
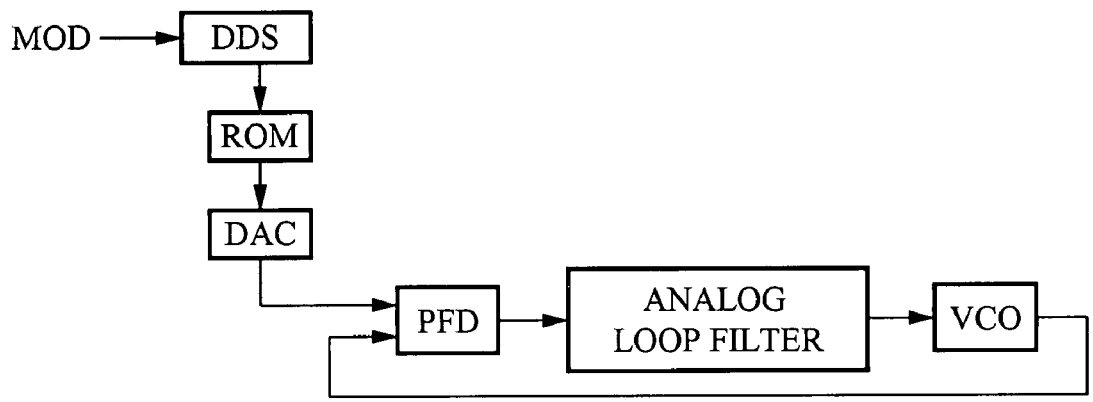
FIG. 2 is a block diagram of a known PLL using DDS.
Figure 3:
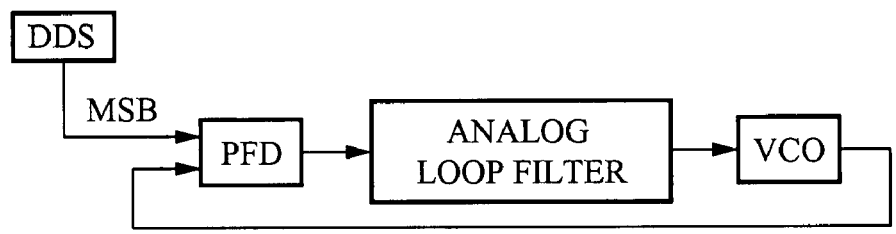
FIG. 3 is a block diagram of a known alternative PLL using DDS.
Figure 4:
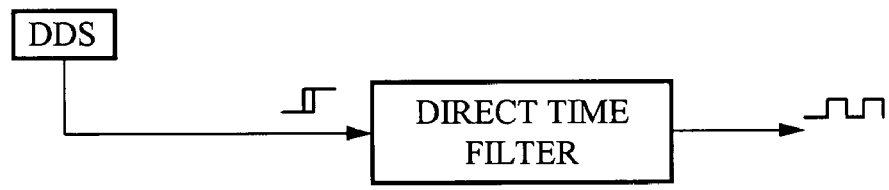
FIG. 4 is a block diagram of a DDS synthesizer using a direct time filter.
Figure 5:
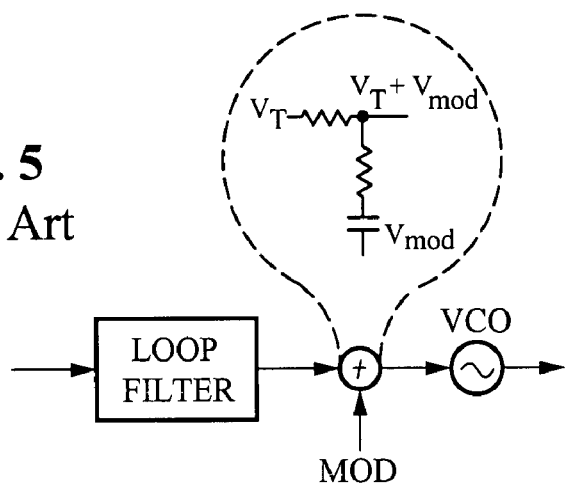
FIG. 5 is a circuit diagram of a portion of a synthesizer illustrating one known modulation technique.
Figure 6:
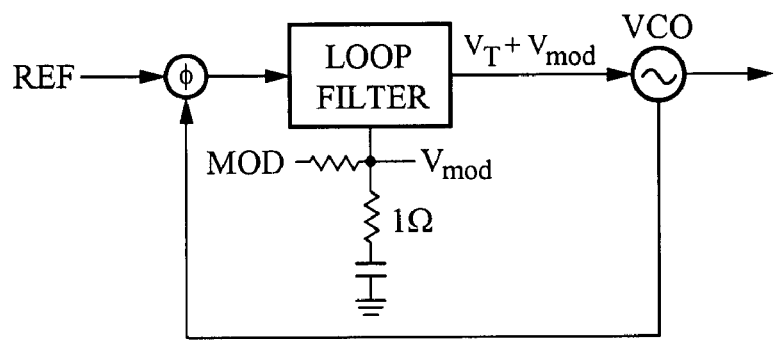
FIG. 6 is a circuit diagram of a portion of a synthesizer illustrating another known modulation technique.
Figure 7:
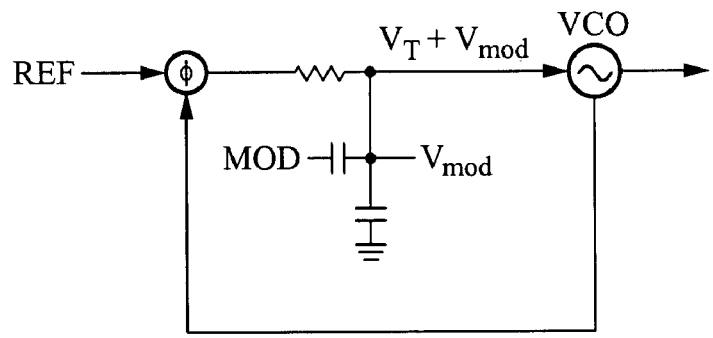
FIG. 7 is a circuit diagram of a portion of a synthesizer illustrating still another known modulation technique.
Figure 22:
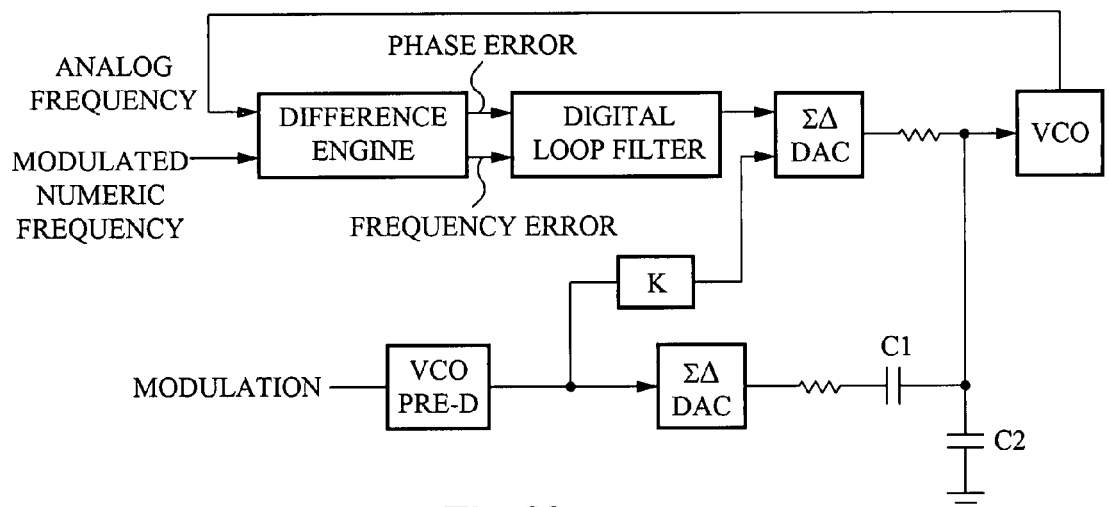
FIG. 22 is a diagram of a further PLL structure.

The circuit of FIG. 21 assumes a time-multiplexed manner of operation, since leakage from the tuning capacitor will result in frequency drift over prolonged periods of time. Better noise characteristics and lower driver requirements may be achieved using a modified circuit, shown in FIG. 22. The circuit of FIG. 22 uses a modulation injection scheme similar to that of FIG. 7. Referring to FIG. 22, a difference engine receives an analog frequency produced by a VCO and a modulated numeric frequency bitstream. An output signal of the difference engine is filtered using a digital filter, which is followed by a DAC. In an exemplary embodiment, the DAC is a Sigma-Delta DAC that outputs a waveform the period of which is modulated in accordance with the applied voltage. The output signal of the DAC is applied through a resistor to an integrating capacitor C2 (no charge pump current sources are used). The voltage stored on the integrating capacitor is applied to the VCO. A separate modulation path is used to inject a modulation voltage into the circuit in accordance with the principles previous elucidated. A digital modulation signal is applied to a modulation DAC (also Sigma-Delta). An output signal of the modulation DAC is applied through a resistor to a capacitor C1, which forms a capacitive divider network with the integrating capacitor C2, after the manner of FIG. 7. The series RC combination in the modulation path has a desirable filtering effect on the output signal of the modulation DAC. Note that modulation is injected at two different points in the circuit, through the main loop and through the separate modulation path. When the modulation is changed, it is changed at these two different points at the same time. To ensure proper operation, it becomes necessary to "dose" part of the modulation signal from the separate modulation path to the main loop. To accomplish this dosing, the modulation input signal of the separate modulation path is scaled by a factor K and input to the summing DAC of the main loop. In an exemplary embodiment, K=C1/(C1+C2).

Figure 23:
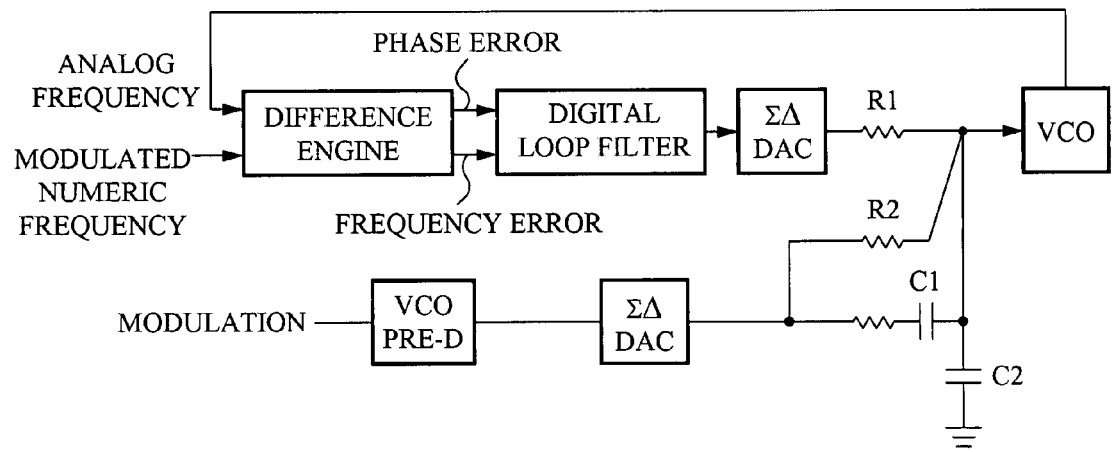
FIG. 23 is a diagram of an alternative construction of the PLL structure of FIG. 22.

Referring to FIG. 23, in an alternative embodiment, the foregoing dosing may be performed in analog fashion using a resistor R2 coupled from the output of the DAC in the modulation path to the top plate of the integrating capacitor. In an exemplary embodiment, R1/R2=C1/C2.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A circuit including a feedback loop for tracking an input signal having modulation applied thereto, comprising:
    a controlled oscillator producing an output signal;
    a slow modulation circuit, including a loop filter, coupled to the input signal and to the controlled oscillator; and
    a fast modulation circuit coupled to the input signal and to the controlled oscillator, the fast modulation circuit including a compensation circuit configured to output an altered input signal, the compensation circuit referring to predetermined information to alter the input signal in accordance with an output frequency characteristic of the controlled oscillator, thereby improving linearity of the output signal.

2. The apparatus of claim 1, wherein the compensation circuit is configured to alter the input signal by referring to a lookup table.

3. A method of controlling a variable oscillator to produce an output signal, using circuitry including a slow modulation circuit having a loop filter and a fast modulation circuit having a compensation circuit, both the slow and the fast modulation circuit being coupled to an input signal and to the variable oscillator, the method comprising:
    determining an output frequency characteristic of the variable oscillator; and
    within the compensation circuit configured to output an altered input signal, the compensation circuit referring to predetermined information to alter the input signal in accordance with the output frequency characteristic of the controlled oscillator, thereby improving linearity of the output signal.

4. The method of claim 3, wherein the variable oscillator and said circuitry are incorporated within a device, and the output frequency characteristic of the variable oscillator is determined automatically during use of the device by a user.

5. The method of claim 4, wherein the compensation circuit includes a lookup table, the method further comprising updating contents of the lookup table during use of the device.

6. The apparatus of claim 1, wherein the slow modulation circuit is configured to receive a feedback signal based on the output signal, and
    the compensation circuit is configured to output the altered input signal without referring to the feedback signal.

7. The apparatus of claim 1 wherein the slow modulation circuit further includes a difference engine receiving the input signal and the output signal and generating a phase error signal which is transmitted to the loop filter.

8. The apparatus of claim 7 wherein the difference engine generates the phase error signal and a frequency error signal which are transmitted to the loop filter.

9. The apparatus of claim 8 wherein the slow modulation circuit further includes a charge pump connected to the loop filter and the controlled oscillator.

10. The apparatus of claim 2 wherein the lookup table is periodically updated to account for changes in characteristics of the controlled oscillator.

11. The method of claim 3, wherein the slow modulation circuit is configured to receive a feedback signal based on the output signal, and
    the compensation circuit is configured to output the altered input signal without referring to the feedback signal.

12. In a phase lock loop including a controlled oscillator producing an output signal for high-data-rate transmission, the improvement comprising:
    a slow modulation circuit, including a loop filter, coupled to an input signal and to the controlled oscillator, the slow modulation circuit configured to receive a feedback signal based on the output signal; and
    a fast modulation circuit coupled to the input signal and to the controlled oscillator, the fast modulation circuit including a compensation circuit configured to output an altered input signal without referring to the feedback signal, the compensation circuit referring to a lookup table, which is periodically updated to account for changes in characteristics of the controlled oscillator, to alter the input signal in accordance with an output frequency characteristic of the controlled oscillator, thereby improving linearity of the output signal.

* * * * *